(12) United States Patent
Kwon et al.

(10) Patent No.: US 7,944,458 B2
(45) Date of Patent: *May 17, 2011

(54) DIGITAL-ANALOG CONVERTER, DATA DRIVER, AND FLAT PANEL DISPLAY DEVICE USING THE SAME

(75) Inventors: Oh Kyong Kwon, Seoul (KR); Byong Deok Choi, Seoul (KR)

(73) Assignee: Samsung Mobile Display Co., Ltd., Yongin-City (KR)

( * ) Notice: Subject to any disclaimer, the term of this patent is extended or adjusted under 35 U.S.C. 154(b) by 1064 days.

This patent is subject to a terminal disclaimer.

(21) Appl. No.: 11/656,805

(22) Filed: Jan. 22, 2007

(65) Prior Publication Data

US 2007/0182692 A1    Aug. 9, 2007

(30) Foreign Application Priority Data

Feb. 9, 2006  (KR) .................. 10-2006-0012558

(51) Int. Cl.
G09G 5/10    (2006.01)
(52) U.S. Cl. .................. 345/690; 345/691; 345/692
(58) Field of Classification Search .......... 345/63, 345/77, 80, 87, 89, 98–100, 204, 205, 210–214, 345/690; 365/51, 189.09; 714/726; 349/37, 349/151, 152
See application file for complete search history.

(56) References Cited

U.S. PATENT DOCUMENTS

| | | | |
|---|---|---|---|
| 4,394,662 A * | 7/1983 | Yoshida et al. ............. 346/33 R | |
| 5,170,158 A | 12/1992 | Shinya | |
| 6,252,567 B1 | 6/2001 | Budzelaar | |
| 6,310,593 B1 | 10/2001 | Nakao | |
| 6,897,846 B2 | 5/2005 | Youn | |
| 6,980,189 B2 * | 12/2005 | Maruoka et al. ............. 345/94 |
| 7,221,349 B2 * | 5/2007 | Hashido et al. ............. 345/89 |
| 7,239,297 B2 * | 7/2007 | Tajima et al. ............. 345/89 |
| 7,542,031 B2 * | 6/2009 | Jo et al. .............. 345/211 |

(Continued)

FOREIGN PATENT DOCUMENTS

CN    1287653 A    3/2001

(Continued)

OTHER PUBLICATIONS

Korean Patent Abstracts, Publication No. 1020020056354; Date of Publication Jul. 10, 2002; for Korean Registration No. 10-0375203, granted Feb. 25, 2003; in the name of Kwon.

(Continued)

*Primary Examiner* — Prabodh M Dharia
(74) *Attorney, Agent, or Firm* — Christie, Parker & Hale, LLP

(57) ABSTRACT

A digital-analog converter (DAC) including: a gray scale generator for generating gray scale voltages corresponding to digital data input through charge sharing between a plurality of data lines and a plurality of dummy data lines; a switching signal generator for providing operation control signals for a plurality of switches of the gray scale generator; and a reference voltage generator for generating reference voltages and for providing the reference voltages to the gray scale generator. According to the present invention, the digital-analog converter uses capacitance components existing in the respective data lines and the dummy data lines as a sampling capacitor and a holding capacitor to generate desired gray scale voltages through charge sharing between the data lines and the dummy data lines, thereby reducing area and power consumption over an existing R-string type of DAC.

20 Claims, 8 Drawing Sheets

U.S. PATENT DOCUMENTS

| | | | |
|---|---|---|---|
| 2002/0060657 A1* | 5/2002 | Matsueda et al. | 345/89 |
| 2002/0158828 A1* | 10/2002 | Isami et al. | 345/89 |
| 2003/0030614 A1* | 2/2003 | Tajima et al. | 345/89 |
| 2003/0146896 A1 | 8/2003 | Sekine | |
| 2004/0125422 A1 | 7/2004 | Wang et al. | |
| 2004/0174448 A1 | 9/2004 | Azami | |
| 2004/0207779 A1 | 10/2004 | Herrmann | |
| 2004/0251844 A1* | 12/2004 | Hashido et al. | 315/169.3 |
| 2005/0259099 A1* | 11/2005 | Jo et al. | 345/211 |
| 2007/0182692 A1* | 8/2007 | Kwon et al. | 345/100 |
| 2007/0242535 A1* | 10/2007 | Kajigaya et al. | 365/189.09 |

FOREIGN PATENT DOCUMENTS

| | | |
|---|---|---|
| CN | 1398391 A | 2/2003 |
| JP | 5-204339 | 8/1993 |
| JP | 06-224768 | 8/1994 |
| JP | 07-199866 | 8/1995 |
| JP | 10-326089 | 12/1998 |
| JP | 2001-134249 | 5/2001 |
| JP | 2001-215472 | 8/2001 |
| JP | 2002-505828 | 2/2002 |
| JP | 2002-108296 | 4/2002 |
| JP | 2002-202762 | 7/2002 |
| JP | 2003-114415 | 4/2003 |
| JP | 2003-162265 | 6/2003 |
| JP | 2003-228339 | 8/2003 |
| JP | 2003-344824 | 12/2003 |
| JP | 2004-295103 | 10/2004 |
| JP | 2004-356875 | 12/2004 |
| JP | 2004-361841 | 12/2004 |
| JP | 2005-024821 | 1/2005 |
| JP | 2005-070627 | 3/2005 |
| JP | 2005-134435 | 5/2005 |
| JP | 2005-242294 | 9/2005 |
| JP | 2005-346077 | 12/2005 |
| JP | 2006-030921 | 2/2006 |
| KR | 2002-0004281 | 1/2002 |
| KR | 10-0375203 | 2/2003 |
| KR | 10-2003-0061553 A | 7/2003 |
| KR | 2003-0057771 | 7/2003 |
| KR | 10-2004-0041810 A | 5/2004 |
| KR | 10-2004-0060708 | 7/2004 |
| KR | 10-2005-0000161 A | 1/2005 |
| KR | 10-2005-0116098 | 12/2005 |
| KR | 10-2006-0011509 | 2/2006 |
| KR | 10-2006-0037861 | 5/2006 |
| WO | WO 98/48317 | 10/1998 |
| WO | WO 00/23977 | 4/2000 |
| WO | WO 02/21496 A2 | 3/2002 |
| WO | WO 2005/017867 A1 | 2/2005 |
| WO | WO 2005/078696 A1 | 8/2005 |

OTHER PUBLICATIONS

Korean Patent Abstracts, Publication No. 1020060037861 A; Date of Publication: May 3, 2006; in the name of Lee.

U.S. Office action dated Sep. 21, 2009, for related U.S. Appl. No. 11/606,570, noting listed WO 2005/017867 in this IDS, as well as U.S. Publication 2003/0146896 previously filed in an IDS dated Aug. 6, 2007.

European Search Report dated Jul. 3, 2007 for European application 07250231.3.

European Search Report dated Aug. 25, 2008, for European application 07250231.3.

European Search Report dated Jun. 27, 2007 for European application 07250525.8.

European Search Report dated Aug. 25, 2008 for European application 07250525.8.

SIPO Office action dated Mar. 28, 2008 for Chinese application 200610168767.0, with English translation.

Japanese Office action dated Dec. 16, 2008, for Japanese application 2006-252661.

SIPO Office action dated Aug. 8, 2008 for Chinese application 200710004221.6, with English translation.

Patent Abstracts of Japan, Publication No. 2005-024821, dated Jan. 27, 2005, in the name of Kensuke Maezono.

Patent Abstracts of Japan, Publication No. 2005-070627, dated Mar. 17, 2005, in the name of Masaharu Takahashi.

Korean Patent Abstracts, Publication No. 10-2003-0061553, dated Jul. 22, 2003, in the name of Seok U Lee at al.

Korean Patent Abstracts, Publication No. 10-2004-0041810, dated May 20, 2004, in the name of Jae U Lee et al.

Korean Patent Abstracts, Publication No. 10-2005-0000161, dated Jan. 3, 2005, in the name of Jeong Woo Jang et al.

Japanese Office action dated Mar. 30, 2010, for corresponding Japanese Patent application 2006-199463, noting listed references in this IDS.

Search Report dated May 15, 2007 for European Patent Application No. 07250524.1-2205.

Office action issued by The State Intellectual Property Office of P.R. China on Jun. 6, 2008 for related Application No. 2007100019900 indicating relevance of reference cited herein.

Japanese Office action dated Sep. 7, 2010, for corresponding Japanese Patent application 2006-199463, noting listed reference in this IDS, as well as several Japanese references previously filed in an IDS dated May 21, 2010, and WO 2005/078696, previously filed in an IDS dated Mar. 10, 2010.

U.S. Office action dated Oct. 7, 2010, for cross-reference U.S. Appl. No. 11/700,348.

European Search Report dated Jul. 2, 2007 for European Patent application 07250542.3.

Japanese Office action dated Mar. 23, 2010, for Japanese Patent application 2006-217194.

Japanese Office action dated Sep. 14, 2010, for Japanese Patent application 2006-217194.

* cited by examiner

DIGITAL-ANALOG CONVERTER, DATA DRIVER, AND FLAT PANEL DISPLAY DEVICE USING THE SAME

CROSS-REFERENCE TO RELATED APPLICATION

This application claims priority to and the benefit of Korean Patent Application No. 10-2006-0012558, filed on Feb. 09, 2006, in the Korean Intellectual Property Office, the entire content of which is incorporated herein by reference.

BACKGROUND

1. Field of the Invention

The present invention relates to a flat panel display device, and more particularly, to a digital-analog converter provided in the flat panel display device and a data driver using the digital-analog converter.

2. Discussion of Related Art

A flat panel display device includes a display panel, a scan driver, and a data driver. The scan driver sequentially outputs scan driving signals to a plurality of scan lines formed on the display panel, and the data driver outputs R, G, B image signals to data lines on the display panel. Non-limiting examples of a flat panel display device include a liquid crystal display device, a field emission display device, a plasma display panel, a light emitting display device, etc.

FIG. 1 is a block diagram showing a conventional data driver.

Here, the data driver will be described on the assumption that it has n channels.

Referring to FIG. 1, the data driver includes: a shift register unit 110, a sampling latch unit 120, a holding latch unit 130, a digital-analog converter (DAC) 140, and an amplifier 150.

The shift register unit 110 receives a source shift clock (SSC) and a source start pulse (SSP) from a timing controller (not shown), and generates n sampling signals in sequence, while allowing the source start pulse (SSP) to be shifted for every one period of the source shift clock (SSC). To generate the n sampling signals, the shift register unit 110 includes n shift registers.

The sampling latch unit 120 sequentially stores data in response to the sampling signals supplied from the shift register 110 in sequence. Here, the sampling latch unit 120 is provided with n sampling latches for storing n digital data. Also, the respective sampling latches have sizes corresponding to the number of bits of the data. For example, when the data is configured to have k bits, the respective sampling latches are set to have a size of k bits.

The holding latch unit 130 receives and stores the data from the sampling latch unit 120 when a source output enable (SOE) signal is input. Also, the holding latch unit 130 supplies the data stored therein to a DAC 250, when the source output enable (SOE) signal is input. Here, the holding latch unit 130 is provided with n holding latches for storing n data. Also, the respective holding latches have sizes corresponding to the number of bits of the data. For example, the respective holding latches are set to have a size of k bits for storing the data having k bits.

The DAC 140 generates an analog signal corresponding to the bit value of the input digital data, and the DAC 140 selects any one of a plurality of gray scale voltages (or gray levels) corresponding to the bit value of the data supplied from the holding latch unit 130, thereby generating an analog data signal accordingly.

The amplifier 150 amplifies the digital data converted into the analog signal to a certain or predetermined level and thus outputs it through data lines on the panel.

As such, the data driver of FIG. 1 outputs one data per one horizontal period. That is, after the data driver samples and holds one digital R, G, B data (or one set of R, G, B data) during one horizontal period, it converts them into analog R, G, B data and amplifies and outputs them at a certain or predetermined width. In addition, when the holding latch unit 130 holds the R, G, B data corresponding to $n^{th}$ column line, the sampling latch unit 120 samples the R, G, B data corresponding to $n+1^{th}$ column line.

FIG. 2 is a block diagram showing the DAC shown in FIG. 1.

Referring to FIG. 2, a conventional DAC 140 includes: a reference voltage generator 142, a level shifter 144 and a switch array 146.

As shown in FIG. 2, the DAC 140 uses a reference voltage generator 142 having R-strings R1, R2, ... Rn for generating correct gray scale voltages and/or gamma-corrections, and includes a ROM type of a switch array 146 for selecting the voltages generated through the reference voltage generator 142.

The DAC 140 includes a level shifter for converting and providing a voltage level for digital data input through the sampling latch unit (120 in FIG. 1) to the switch array 146.

The DAC 140 has a disadvantage because power consumption is increased due to a static current of the R-strings. In order to overcome this disadvantage, an approach has been developed in which the R-strings are designed with large resistance values for reducing the static current flowing in the R-strings, and in which the desired gray scale voltages are applied to the respective data lines by using an analog buffer in the respective channels as the amplifier 150. However, this approach has a disadvantage because image quality is deteriorated due to the output voltage difference between channels, when threshold voltages and mobility of certain transistors constituting portions of the analog buffer are not uniform.

Also, in implementing a gray scale of 6 bits, 6*64 switches for selecting one of 64 gray scale voltages (or gray levels) should be built in the respective channels, causing a disadvantage in that circuit area is greatly increased. In an embodiment of the prior art, the area of a DAC implementing the gray scale of 6 bits occupies more than half of the area of a data driver.

As the bits of a gray scale (or the number of gray levels) are increased, even more circuit area may be needed. For example, in implementing a gray scale of 8 bits, the circuit area of the DAC can be increase to more than four times the circuit area of the DAC implementing the gray scale of 6 bits.

Also, recently, a flat panel display device using a system on panel (SOP) process that uses polycrystalline silicon TFTs to integrate driver(s), etc., along with a display region on a substrate has been developed. The above described disadvantages of the conventional DAC, i.e., the problems of power consumption and/or area usage, and the problem of implementing the analog buffer as the amplifier, become even more pronounced, when the flat panel display device is implemented using the SOP process.

SUMMARY OF THE INVENTION

It is an aspect of the present invention to provide a digital-analog converter (DAC), a data driver, and a flat panel display device using thereof that can generate desired gray scale voltages through charge sharing between data lines and dummy data lines provided on a panel of the display device to remove an R-string, a decoder and a switch array of a conventional DAC and to remove an analog buffer as an amplifier provided in the rear end of the conventional DAC, thereby minimizing circuit area and power consumption of the DAC of the present invention and improving yield thereof.

According to a first embodiment of the present invention, there is provided a digital-analog converter (DAC) including: a gray scale generator for generating gray scale voltages corresponding to digital data input through charge sharing between a plurality of data lines and a plurality of dummy data lines; a switching signal generator for providing operation control signals for a plurality of switches of the gray scale generator; and a reference voltage generator for generating reference voltages and for providing the reference voltages to the gray scale generator.

According to a second embodiment of the present invention, there is provided a data driver including: a shift register for providing sampling signals by generating a shift register clock; a sampling latch unit for sampling and latching digital data having a plurality of bits by receiving the sampling signals for every column line; a holding latch unit for simultaneously receiving and latching digital data latched in the sampling latch unit, and for converting and outputting the digital data in a serial state for each of the bits of the digital data; and a digital-analog converter for generating the gray scale voltages to correspond to bit values of the digital data supplied from the holding latch unit in a serial state through charge sharing between a plurality of data lines and a plurality of dummy data lines provided on a panel of a display device including the data driver and for providing the gray scale voltages to the data lines.

According to a third embodiment of the present invention, there is provided a flat panel display device including: a display region including a plurality of pixels connected with a plurality of scan lines arranged in a first direction, a plurality of data lines arranged in a second direction and a plurality of dummy data lines formed adjacent to the respective data lines; a data driver for supplying gray scale voltages to the plurality of pixels; and a scan driver for supplying scan signals to the scan lines, wherein the data driver generates the gray scale voltages corresponding to the digital data input through charge sharing between the data lines and the dummy data lines and provides the gray scale voltages to corresponding ones of the pixels.

According to a fourth embodiment of the present invention, there is provided a data driving method of a flat panel display device including: serially inputting each of a plurality of bits of digital data; executing charge sharing between respective data lines and dummy data lines formed adjacent to the respective data lines for a plurality of periods during which each of the plurality of bits of the digital data is input; and applying a result of the charge sharing executed at a last one of the plurality of periods to corresponding ones of the pixels through the data lines as final gray scale voltages.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

Figure 3:
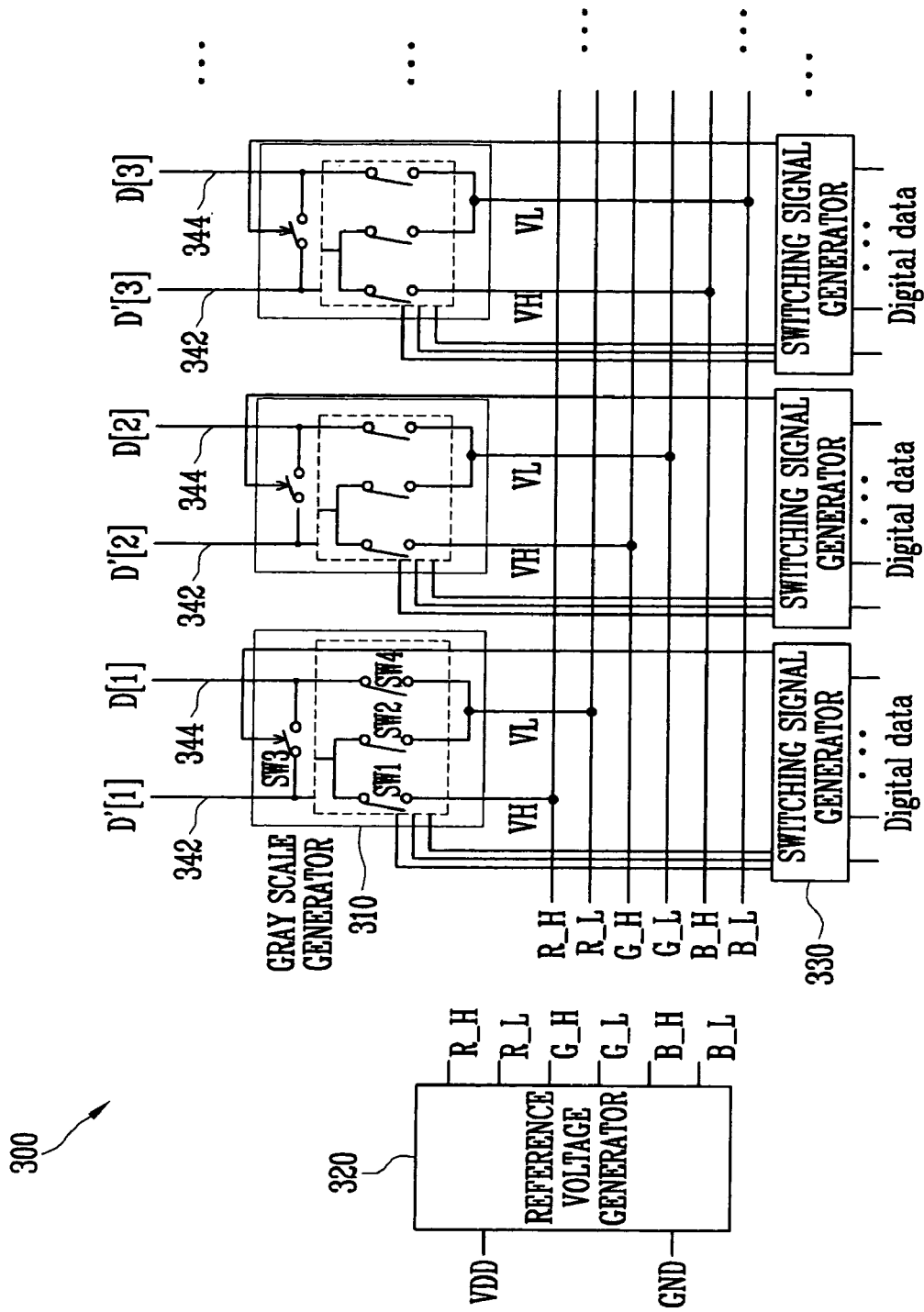
FIG. 3 is a block diagram showing a DAC according to an embodiment of the present invention.

FIG. 3 is a block diagram showing a digital-analog converter (DAC) 300 according to an embodiment of the present invention.

In one embodiment, the digital-analog converter (DAC) 300 is provided in a data driver of a flat panel display device.

In one embodiment, the DAC 300 uses respective parasitic capacitance components existing in a plurality of data lines and a plurality of dummy data lines provided on a panel of a display device as a holding capacitor and a sampling capacitor, thereby generating analog gray scale voltages corresponding to digital data input through charge sharing between the data lines and the dummy data lines and providing the gray scale voltages to the corresponding pixels.

Referring to FIG. 3, the DAC 300 according to an embodiment of the present invention includes: a gray scale generator 310 for executing charge sharing (or sharing of charges) between the dummy data lines 342 and the data lines 344 formed in pairs, respectively; a switching signal generator 330 for providing operation control signals for a plurality of switches provided in the gray scale generator 310; and a reference voltage generator 320 for generating reference voltages and providing them to the gray scale generator 310.

Here, the reference voltage generator 320 generates the respective high level and low level of reference voltages for every red, green, and blue (R, G, B) data and provides them to the gray scale generator 310.

In one embodiment of the present invention, the data lines to which certain or predetermined gray scale voltages are applied function to provide the gray scale voltages to corresponding pixels connected to the data lines 344, along with the dummy data lines 342 formed adjacent to the data lines 344. In addition, the data lines are used to provide parasitic capacitance components existing in the data lines 344 and the dummy data lines 342 themselves.

The data lines 344 and the dummy data lines 342 can be modeled in the form of a plurality of resistors and capacitors that are connected, and therefore the respective capacitance components in the data lines 344 and the dummy data lines 342 can be modeled or standardized with certain or predetermined values depending on panel size, etc.

The embodiment of the present invention uses the respective capacitance components for the dummy data lines 342 and the data lines 344 that are adjacent to each other as a sampling capacitor and a holding capacitor, thereby generating analog gray scale voltages corresponding to the digital data input through the charge sharing between the dummy data lines 342 and the data lines 344 and providing the gray scale voltages to the corresponding pixels connected to the data lines 344 through the data lines 344. However, the present invention is not limited by the above described embodiment. For example, it is possible to generate gray scale voltages corresponding to the digital data input by executing the charge sharing between a plurality of dummy data lines formed on a panel of a display device and to provide the gray scale voltages to the corresponding pixels connected to the data lines through the data lines adjacent to the dummy data lines.

Also, it is possible to generate gray scale voltages to be provided to pixels connected to the respective data lines by executing the charge sharing between one dummy data line and a plurality of data lines (e.g., j data lines), and to provide the gray scale voltages to the respective pixels through the respective data lines. In this case, the line time that the gray scale voltages are applied to the respective pixels is reduced to 1/j of a conventional line time.

Figure 4:
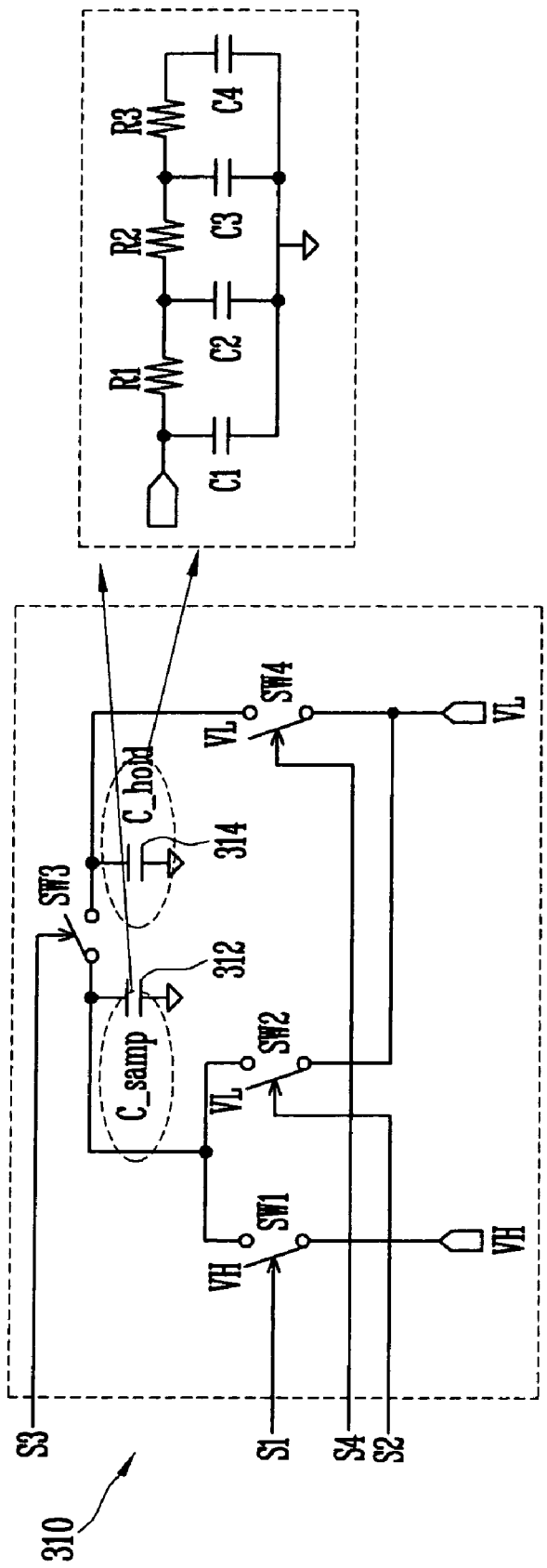
FIG. 4 is a block diagram showing a gray scale generator of the DAC of FIG. 3.
Figure 5:
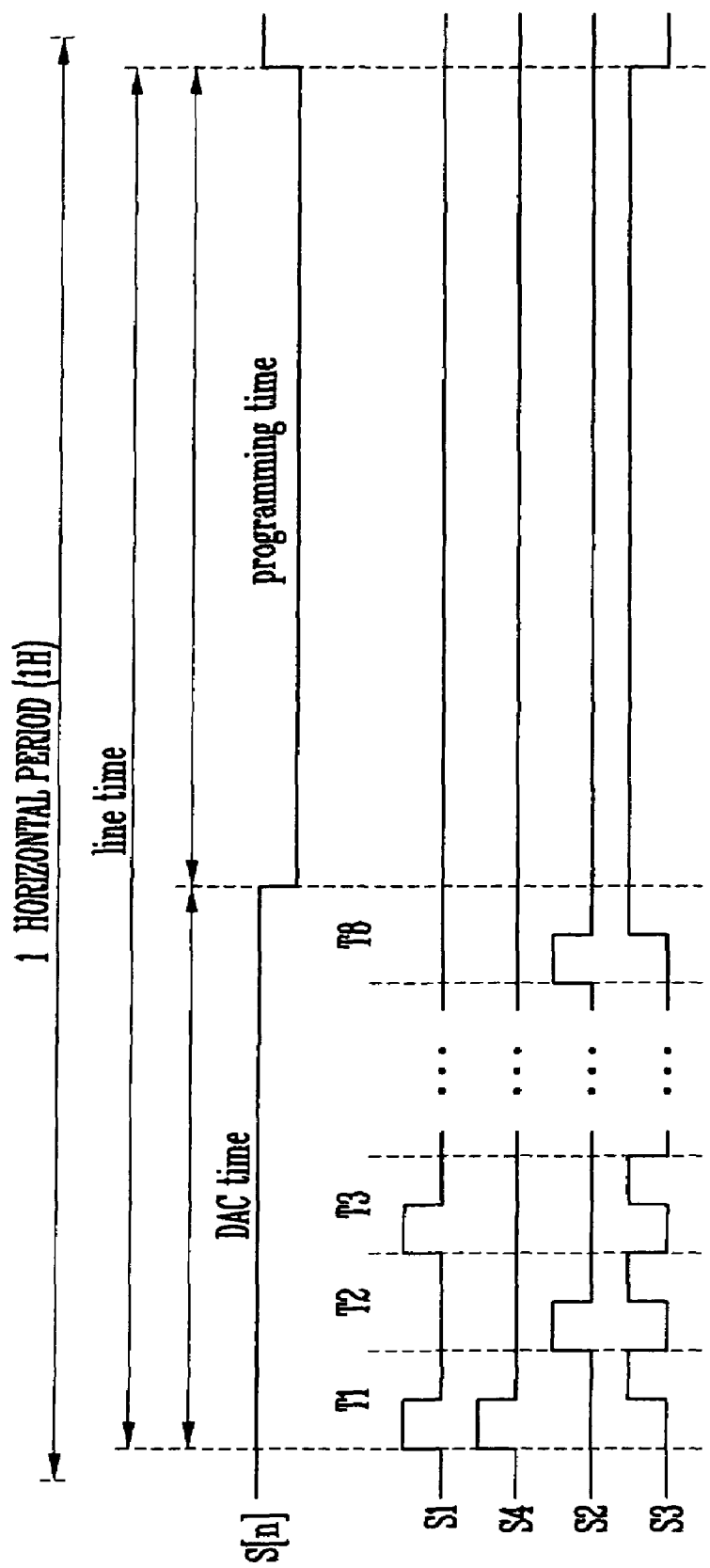
FIG. 5 is a signal waveform diagram showing an example of digital data input to the gray scale generator shown in FIG. 4.

FIG. 4 is a block diagram showing the gray scale generator 310 in more detail, and FIG. 5 is a signal waveform diagram showing an example of the digital data input to the gray scale generator 310 shown in FIG. 4.

Figure 6:
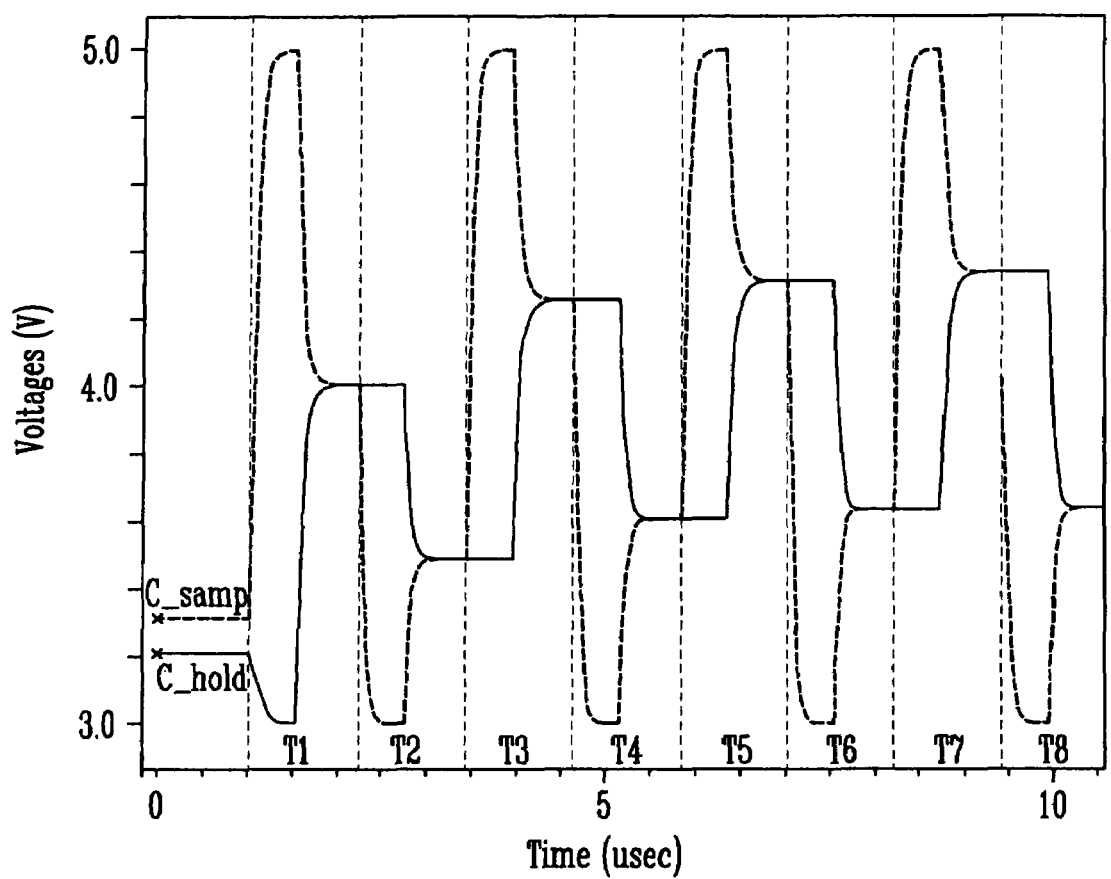
FIG. 6 is a simulation waveform diagram showing outputs of the gray scale generator for the inputs shown in FIG. 5.

Also, FIG. 6 is a simulation waveform diagram showing outputs of the gray scale generator 310 for the inputs as shown in FIG. 5.

However, for convenience of explanation, the embodiment of the present invention will be described on the assumption that the input digital data has 8 bits.

Referring to FIG. 4, the gray scale generator 310 includes: a sampling capacitor C_samp 312 formed by parasitic capacitance components in the dummy data lines 342 in FIG. 3; a holding capacitor C-hold 314 formed by parasitic capacitance components in the data lines 344 in FIG. 3; a first switch SW1 for controlling reference voltage(s) at high level(s) VH to be supplied to the sampling capacitor 312 depending on the respective bit values of the input digital data; a second switch SW2 for controlling reference voltage(s) at low level(s) VL to be supplied to the sampling capacitor 312 depending on the respective bit values of the input digital data; and a third switch SW3 provided for charge sharing between the sampling capacitor 312 and the holding capacitor 314.

Here, the data lines 344 and the dummy data lines 342 are alternately (and repeatedly) formed on the panel of the display device to form the pairs of the data lines 344 and the dummy data lines 342 adjacent to each other, and the respective parasitic capacitance components existing in dummy data lines 342 and data lines 344 formed in pairs are used as the sampling capacitor C_samp 312 and the holding capacitor C-hold 314.

That is, the dummy data lines 342 and the data lines 344 can be modeled by a plurality of resistors R1, R2, R3 and capacitors C1, C2, C3 that are connected, and therefore the respective capacitance values of the dummy data lines and the data lines are modeled or standardized with certain or predetermined values depending on panel size, etc.

In the present invention, the respective parasitic capacitance components in the dummy data lines 342 and the data lines 344 are used as the sampling capacitor C_samp 312 and the holding capacitor C_hold 314.

Also, the gray scale generator (GSG) 310 includes a fourth switch SW4 connected to the holding capacitor C_hold to initialize the holding capacitor C_hold.

Also, the signals S1, S2, S3, S4 for controlling the operations of the first to fourth switches SW1 to SW4 are provided in the switching signal generator 330 as shown in FIG. 3, and the high/low level of reference voltages are provided in the reference voltage generator 320.

In the embodiment of the present invention as shown in FIG. 4, although the parasitic capacitance components existing in the dummy data lines are used as the sampling capacitor C_samp, and the parasitic capacitance components existing in the data lines are used as the holding capacitor C_hold, it is only one embodiment and is therefore not limited thereto. That is, it is also possible to use the parasitic capacitance components in the dummy data lines as the holding capacitor C_hold, and to use the parasitic capacitance components in the data lines as the sampling capacitor C_samp.

An operation of the gray scale generator 310 will be described below with reference to FIG. 4 to FIG. 6.

First, the sampling capacitor C_samp is set to the high level (VH) or the low level (VL) of the reference voltages depending on the least significant bit (LSB) of the input digital data.

That is, when the least significant bit LSB of the input digital data is 1 (LSB=1), the first switch SW1 is turned on to provide the reference voltage at the high level VH to the sampling capacitor C_samp 312, resulting in the sampling capacitor C_samp 312 being set to the reference voltage at the high level VH. In addition, when the least significant bit LSB of the digital data is 0 (LSB=0), the second switch SW2 is turned on to provide the reference voltage at the low level VL to the sampling capacitor C_samp 312, resulting in the sampling capacitor C_samp 312 being set to the low level of reference voltage VL. After this, the charge sharing between the sampling capacitor C_samp 312 and the holding capacitor C_hold 314 is made.

According to the embodiments shown in FIG. 5 and FIG. 6, there is described as an example that the input digital data [d7d6d5d4d3d2d1d0] are [01010101]. Therefore, the LSB of the digital data is 1, resulting in the sampling capacitor C_samp 312 being set to the reference voltage at the high level VH. This is as shown in a simulation graph of FIG. 6.

Also, the holding capacitor C_hold is initialized simultaneously with inputting of the LSB of the sampling capacitor C_samp. This is made by turning on the fourth switch SW4.

The embodiment of the present invention as shown in FIG. 4 represents that the holding capacitor C_hold is initialized as the reference voltage at the low level VL. That is, by turning on the fourth switch SW4, the reference voltage at the low level VL is provided to the holding capacitor C_hold so that the holding capacitor C_hold is initialized with the reference voltage at the low level VL. This is as shown in the simulation graph of FIG. 6.

However, the present invention is not thereby limited and the holding capacitor C_hold can be initialized with the reference voltage at the high level VH.

When assuming that the input digital data are 8 bits as shown in FIG. 5 and FIG. 6, the gray scale generator 310 executes the charge sharing between the sampling capacitor C_samp and the holding capacitor C_hold during the 8 periods where the respective bits are input, and the result is that the $8^{th}$ charge sharing that is finally executed becomes the final gray scale voltages that are applied to the corresponding or predetermined pixels through the data lines.

That is, for the input digital data, in the period T1 for receiving the first LSB and the respective periods T2, T3, T4, T5, T6, T7, and T8 for respectively receiving the next bit from the second lower bit to the most significant bit MSB so that the first switch (when the bit value is 1) or the second switch (when the bit value is 0) is turned on depending on the respective bits to store the certain or predetermined reference voltages in the sampling capacitor C_samp, and the third switch SW3 is turned on for a certain or predetermined period of the respective periods to be stored through the charge sharing between the reference voltages stored in the sampling capacitor C_samp and the voltages stored in the holding capacitor C_hold.

As a result, the certain or predetermined gray scale voltages corresponding to the digital data input through the charge sharing in the last 8$^{th}$ period T8 are generated and provided to the corresponding pixels.

Hereinafter, a process generating the analog gray scale voltages corresponding to the 8 bits of the digital data with [01010101] by the DAC according to the present invention and applying the gray scale voltages to the corresponding or predetermined pixels connected to the data lines will be described in more detail below with reference to FIG. 5 and FIG. 6.

First, the DAC according to the present invention executes the charge sharing for the applied digital data.

Here, referring to FIG. 5, the gray scale voltages corresponding to the pixels connected to the scan lines are generated, and the applied time is referred to as line time.

That is, the line time is the sum of DAC time that the gray scale voltages corresponding to the input digital data are generated and programming time that the generated gray scale voltages are applied to the corresponding pixels. Here, the line time corresponds to the period within one horizontal period 1H.

Accordingly, as shown in FIG. 5, the scan signals provided to the respective scan lines are provided at a low level only during the period corresponding to the programming time.

Here, the DAC time is divided into as many periods as the bits of the digital data, since the charge sharing between the sampling capacitor and the holding capacitor is generated whenever each bit is input. In the present invention, 8 bits of the data are input, and the DAC time is thus divided into eight periods T1 to T8.

First, in the first period T1, the LSB of the input digital data [01010101] is 1 and the first switch SW1 is thus turned on so that the reference voltage at the high level VH is stored in the sampling capacitor C_samp to set the sampling capacitor C_samp to the reference voltage at the high level VH.

Also, the holding capacitor C_hold is provided with the reference voltage at the low level VL by turning on the fourth switch SW4 so that it is initialized with the reference voltage at the low level VL.

Therefore, in the certain or predetermined period of the first period, that is, the period of the remaining first period after the first switch SW1 is turned on, the third switch SW3 is turned on so that the voltages stored in the sampling capacitor C_samp and the charges stored in the holding capacitor C_hold are distributed, thereby being converted and stored into the voltages corresponding to a middle level of voltage stored in the respective sampling and holding capacitors.

Next, in the second period T2, since the second lower bit is 0, the second switch SW2 is turned on so that the reference voltage at the low level VL is stored in the sampling capacitor C_samp and in the certain or predetermined period of the second period, that is, in the remaining second period after the second switch SW2 is turned on, the third switch SW3 is turned on so that the voltages stored in the sampling capacitor C_samp and the charges stored in the holding capacitor C_hold are distributed, thereby being converted and stored into the voltages corresponding to a middle level of voltage stored in the respective sampling and holding capacitors.

Next, from the third period to the eighth period T3~T8, depending on the bits input as in the second period, the first switch SW1 is turned on (when the bit is 1) or the second switch SW2 is turned on (when the bit is 0), resulting in the reference voltage at the high level VH or the reference voltage at the low level being stored in the sampling capacitor, respectively. Among the respective periods in the period after the first switch SW1 or the second switch SW2 is turned on, the third switch SW3 is turned on so that the reference voltages stored in the sampling capacitor C_samp and the charges stored in the holding capacitor C_hold are distributed, resulting in the voltages of a middle level being stored in the sampling and the holding capacitors.

As a result, in the last eighth period T8, the voltages distributed in the sampling and holding capacitors finally become the gray scale voltages corresponding to the input digital data, and such gray scale voltages are provided to the corresponding or predetermined pixels through the data lines.

The digital-analog converter (DAC) 310 according to the present invention as described above uses the capacitance components existing in the pairs of the data lines and the dummy data lines as the sampling capacitor C_samp and the holding capacitor C_hold to generate the desired gray scale voltages through the charge sharing between the data lines and the dummy data lines, thereby greatly reducing power consumption over an existing R-string type of an existing (or conventional) DAC and also reducing the DAC area over an existing (or conventional) DAC area of a related art by removing an R-string, a decoder, and a switch array of the existing DAC.

Also, the signal generator 330 shown in FIG. 3 functions to generate and provide signals S1, S2, S3, S4 for controlling the operations of the plurality of switches provided in the gray scale generator 310, wherein the first and second switches SW1, SW2 are determined to be turned on or off depending on the bit values of the input digital data so that the control signals are generated by the bit values of the digital data output in a serial state through the holding latch unit.

That is, when the digital data bit value is 1, the switching signal generator 330 generates the control signal S1 for allowing the first switch SW1 to be turned on and provides the control signal S1 to the gray scale generator 310, and when the digital data bit value is 0, the switching signal generator 330 generates the control signal S2 for allowing the second switch SW2 to be turned on and provides the control signal S2 to the gray scale generator.

Also, the fourth switch SW4 should be turned on when the holding capacitor is initialized, and the third switch SW3 should be turned on for a certain or predetermined period of the respective line times, that is, for every period where the respective digital data bits are input. Therefore, since the control signals S3, S4 of the third and fourth switches SW3, SW4 are signals that are repeated for every respective data line time regardless of the input digital data, they can be separately generated from a timing controller and used.

Figure 7:
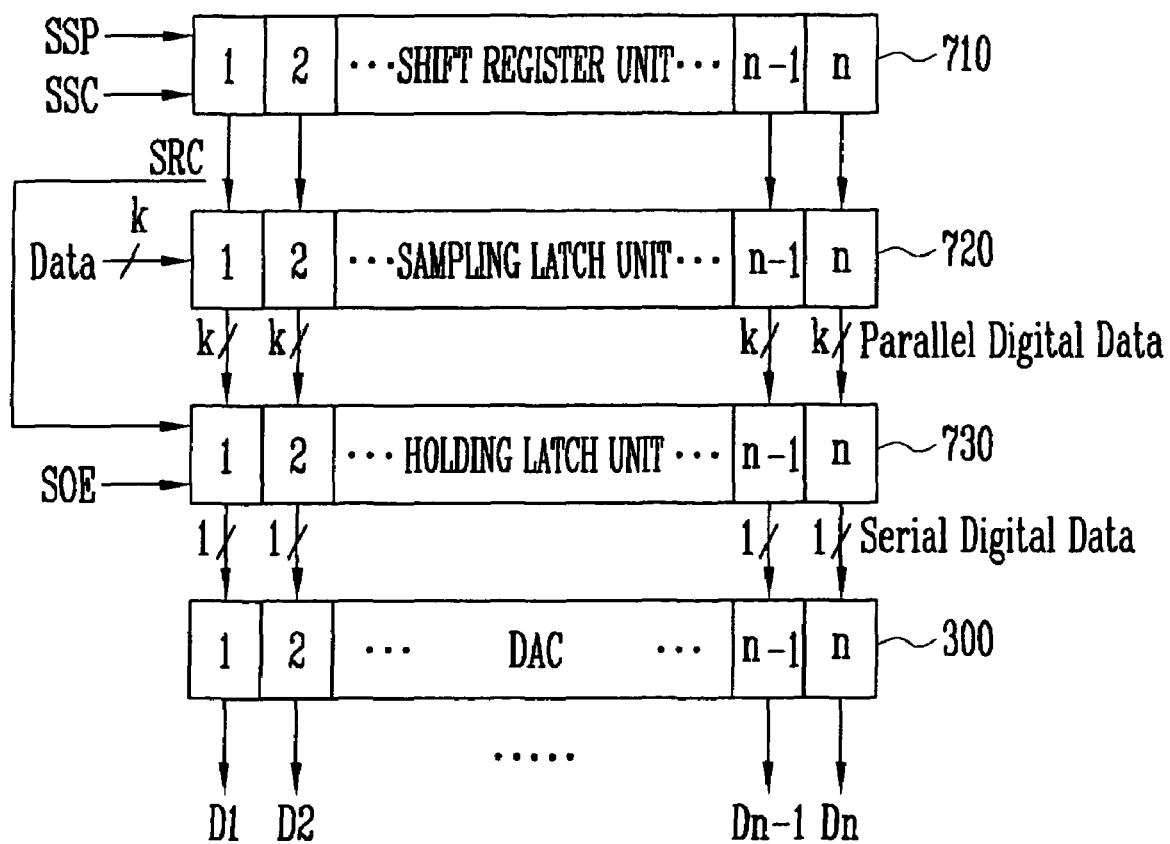
FIG. 7 is a constitutional block diagram showing a data driver according to an embodiment of the present invention.

FIG. 7 is a block diagram showing a data driver according to an embodiment of the present invention.

However, the data driver includes the DAC 300 as described above with reference to FIG. 3 to FIG. 6 and the detailed description of the DAC 300 (including the structures and operations) will not be provided again in more detail.

Referring to FIG. 7, the data driver includes a shift register unit 710, a sampling latch unit 720, a holding latch unit 730, and a digital-analog converter (DAC) 300.

Figure 1:
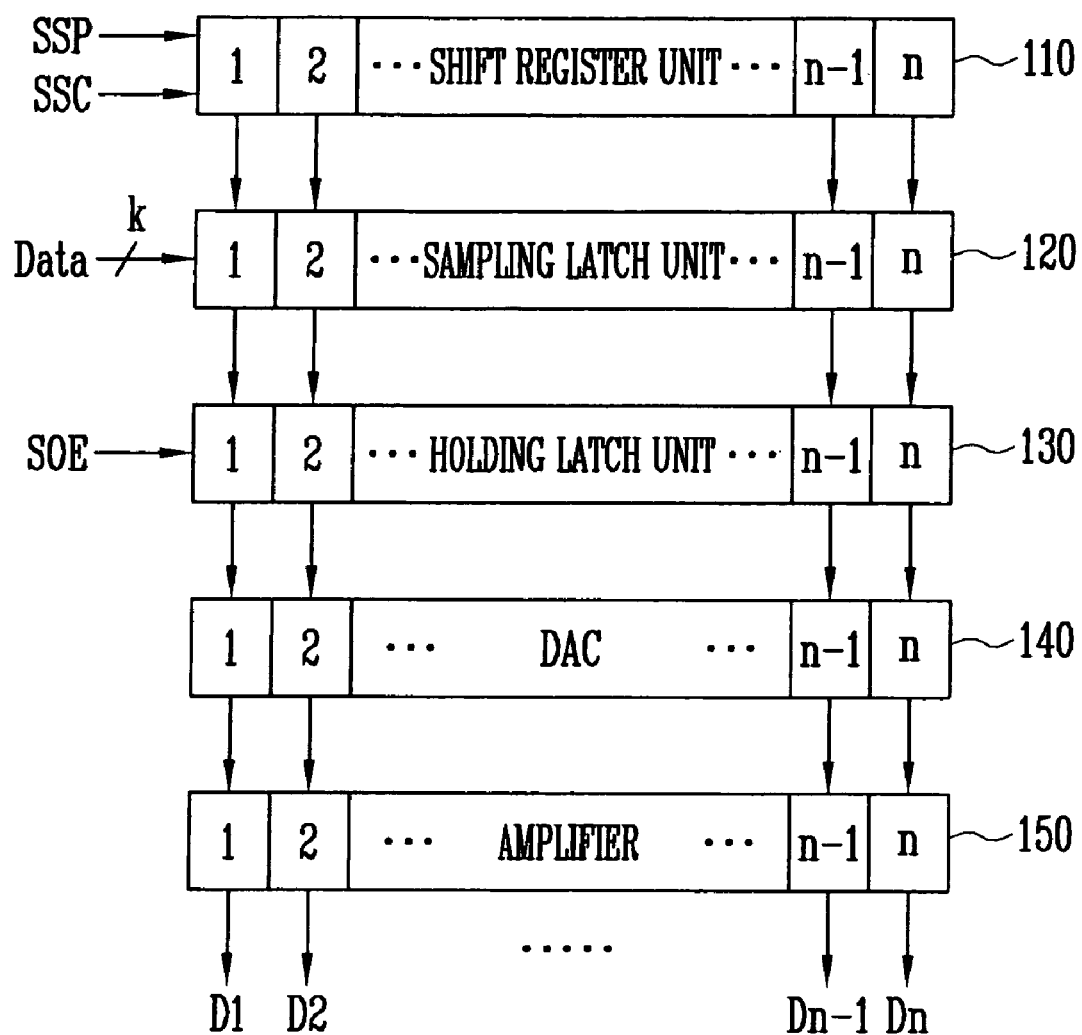
FIG. 1 is a block diagram showing a conventional data driver.
Figure 2:
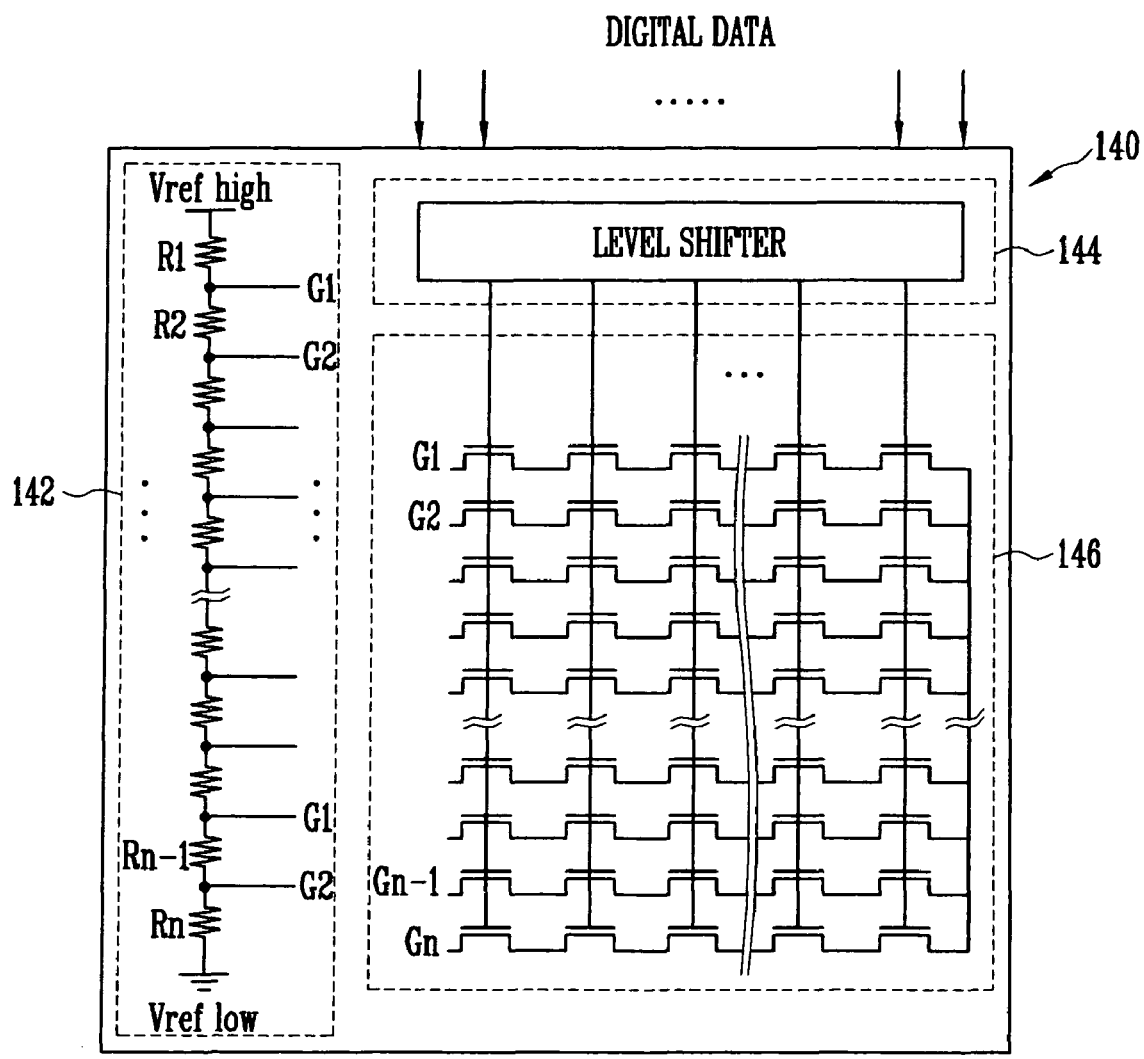
FIG. 2 is a block diagram showing a digital-analog converter (DAC) of the data driver of FIG. 1.
Figure 8:
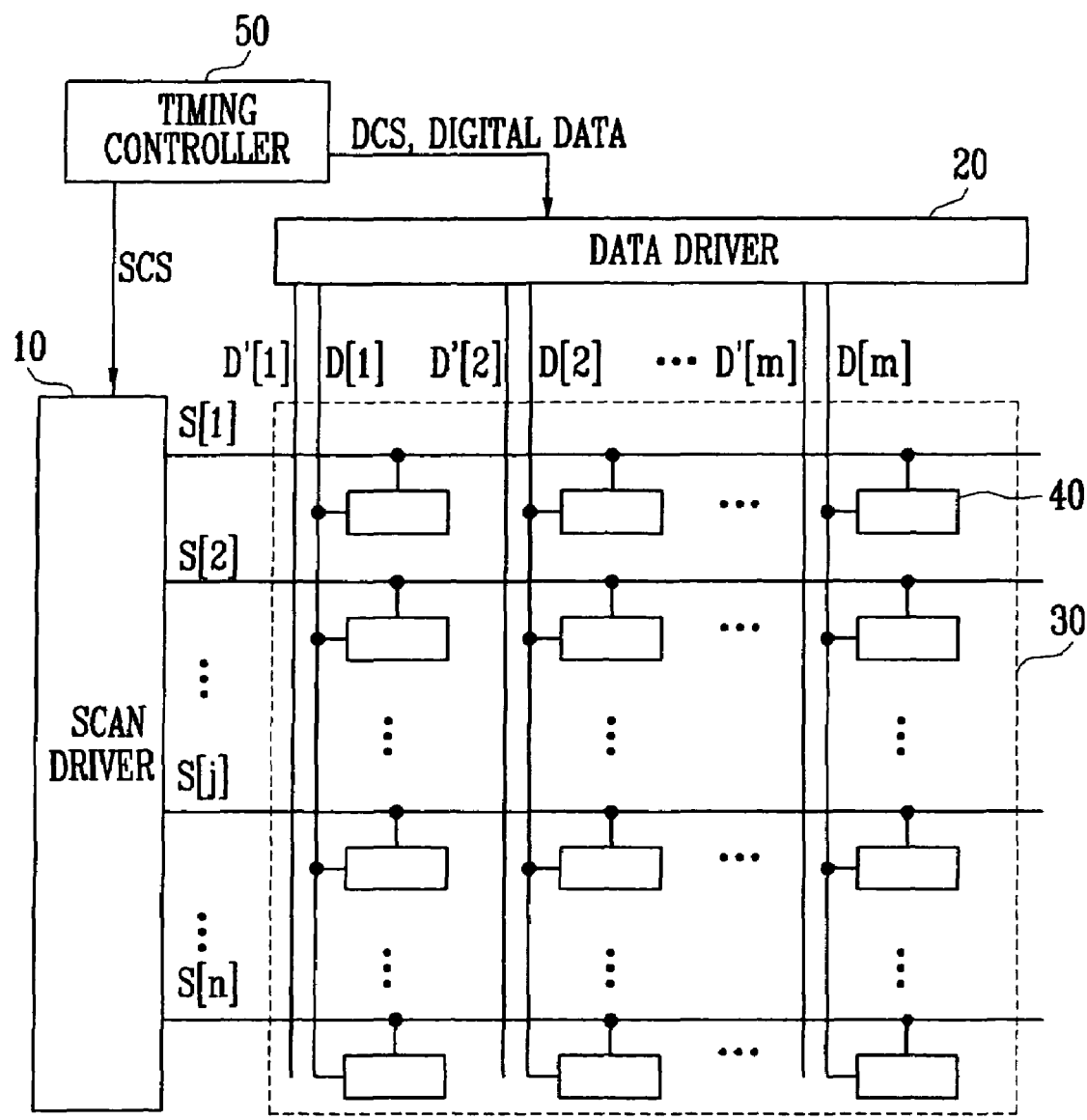
FIG. 8 is a block diagram showing a flat panel display device according to an embodiment of the present invention.

When the data driver of FIG. 8 is compared with the data driver according to the related art (e.g., shown in FIG. 1), the DAC 300 can be changed such that an analog buffer may not need to be used as an amplifier. As such, the data driver 300 of FIG. 7 has an advantage in that the deterioration of image quality due to the difference of output voltage between channels caused by the analog buffer with non-uniformity (or unevenness) in threshold voltages and mobility can be overcome because the analog buffer does not have to be used as the amplifier.

Also, recently, a flat panel display device using a system on panel (SOP) process that uses polycrystalline silicon TFTs to integrate driver(s), etc., along with a display region on a substrate, has been developed. Therefore, the data driver according to the embodiment of the present invention is capable of overcoming the problems of power consumption and/or area usage, and also overcoming the problem of implementing analog buffer as the amplifier, even when these problems become even more pronounced, when the flat panel display device is implemented using the SOP process.

In FIG. 7, the shift register unit 710 receives a source shift clock (SSC) and a source start pulse (SSP) from a timing controller (not shown), and generates a shift register clock (SRC) as n sampling signals in sequence, while allowing the source start pulse (SSP) to be shifted for every one period of the source shift clock (SSC). Here, the shift register unit 210 includes n shift registers.

The sampling latch unit 720 sequentially stores data in response to the sampling signals supplied from the shift register 710 in sequence. Here, the sampling latch unit 720 is provided with n sampling latches for storing n digital data. Also, the respective sampling latches have sizes corresponding to the number of bits of the data. For example, when the data is configured to have 8 bits, the respective sampling latches are set to have the size of 8 bits.

That is, the sampling latch unit 720 sequentially stores the input data and then outputs the 8 bits of the digital data to the holding latch unit 730 in a parallel state.

The holding latch unit 730 receives and stores the data from the sampling latch unit 720 when a source output enable (SOE) signal is input. That is, the holding latch unit inputs and stores the 8 bits of the digital data provided in a parallel state.

Also, the holding latch unit 730 supplies the data stored therein to the DAC 740, when the source output enable (SOE) signal is input. Here, the holding latch unit 730 is provided with n holding latches for storing n data. In addition, the respective holding latches have sizes corresponding to the number of bits of the data. For example, the respective holding latches are set to have the size of 8 bits for storing the 8 bits of the data.

In one embodiment of the present invention when the 8 bits of the digital data stored in the holding latch unit 730 are output to the DAC 300, they are converted and output in a serial state.

Here, the holding latch unit 730 receives the shift register clock signal (SRC) generated from the shift register and converts the 8 bits of the digital data into a serial state through the clock signal and outputs the serial digital data to the DAC 300, as shown.

The DAC 300 generates analog signals corresponding to the bit values of the input digital data, and the DAC 300 selects any one of a plurality of gray scale voltages (or gray level signals or gray levels) corresponding to the bit values of the data supplied from the holding latch unit 730, thereby generating the analog data signals and outputting them to the respective data lines.

In the case of the above described embodiment of the present invention, the plurality of data lines and the plurality of dummy data lines formed adjacent to the respective data lines provided on the panel, respectively, are formed in pairs, wherein the DAC 300 uses the parasitic capacitance components existing in at least one of the data lines and at least one of the dummy data lines as the sampling capacitor and the holding capacitor, thereby generating the analog gray scale voltages corresponding to the digital data input through the charge sharing between the data lines and the dummy data lines and providing them to the corresponding pixels. The structures and the operations of the DAC 300 have been described with reference to FIG. 3 to FIG. 6, and the detailed description thereof will not be provided again.

FIG. 8 is a block diagram showing a flat panel display device according to an embodiment of the present invention.

Here, the flat panel display device includes the DAC 300 described above with reference to FIG. 3 to FIG. 6 and the data driver described above with reference to FIG. 7. Therefore, the constitutions and operations of the DAC 300 and the data driver will not be provided again in more detail.

Referring to FIG. 8, the flat panel display device according to the embodiment of the present invention includes: a display region 30 including a plurality of pixels 40 connected to scan lines S[1] to S[n] and data lines D[1] to D[m]; a scan driver 10 for driving the scan lines S[1] to S[n]; a data driver 20 for driving the data lines D[1] to D[m]; and a timing controller 50 for controlling the scan driver 10 and the data driver 20.

The timing controller 50 generates a data driving control signal (DCS) and a scan driving control signal (SCS) in response to synchronizing signals supplied from one or more external sources. The data driving control signal (DCS) generated from the timing controller 50 is supplied to the data driver 20, and the scan driving control signal (SCS) is supplied to the scan driver 10. Also, the timing controller 50 supplies the digital data supplied from an external source to the data driver 20.

The data driver 20 receives the data driving control signal (DCS) from the timing controller 50. Therefore, the data driver 20, receiving the digital data and the data driving control signal (DCS), generates the gray scale voltages corresponding to the digital data and synchronizes the generated gray scale voltages with the scan signals to supply the corresponding gray scale voltages to corresponding or predetermined pixels.

In addition, the flat panel display of FIG. 8 includes a plurality of dummy data lines D'[1] to D'[m] formed adjacent to the respective data lines D[1] to D[m]. Here, in one embodiment, the pixels 40 are connected with the data lines D[1] to D[m], and the pixels 40 are not connected with the dummy data lines D'[1] to D'[m] formed adjacent to the respective data lines D[1] to D[m].

However, in the case of the above described embodiment of the present invention, the plurality of data lines (D[1] to D[m]) and the plurality of dummy data lines (D'[1] to D'[m]) formed adjacent to the respective data lines (D[1] to D[m]) provided on the panel, respectively, are formed in pairs, wherein when generating the gray scale voltages, the embodiment uses the respective parasitic capacitance components existing in the pairs of the data lines and the dummy data lines as the sampling capacitor and the holding capacitor, thereby generating the analog gray scale voltages corresponding to the digital data input through the charge sharing between the data lines (D[1] to D[m]) and the dummy data lines (D'[1] to D'[m]) and providing the gray scale voltages to the corresponding pixels. The structures and the operations of the DAC 300 and the data driver for generating the gray scale voltage have been described above, and the detailed description thereof will not be provided again.

In view of the foregoing, an embodiment of the present invention uses the parasitic capacitance components existing in data lines and dummy data lines as a holding capacitor and a sampling capacitor to generate desired gray scale voltages through charge sharing between the data lines and the dummy data lines, thereby greatly reducing area and power consumption over the existing R-string type of DAC.

Also, an embodiment of the present invention can remove an R-string, a decoder, and a switch array of the existing DAC, thereby further reducing the area of DAC over the existing R-string type of DAC.

In addition, when manufacturing the data driver by using a SOP process, an embodiment of the present invention has an advantage in that the deterioration of image quality due to a difference of output voltage between channels due to an analog buffer having variation in threshold voltages and mobility can be overcome because the analog buffer does not have to be used as an amplifier.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A digital-analog converter comprising:
   a gray scale generator for generating gray scale voltages corresponding to digital data input through charge sharing between a plurality of data lines and a plurality of dummy data lines;
   a switching signal generator for providing operation control signals for a plurality of switches of the gray scale generator; and
   a reference voltage generator for generating reference voltages and for providing the reference voltages to the gray scale generator.

2. The digital-analog converter as claimed in claim 1, wherein the charge sharing is executed by using respective parasitic capacitance components existing in the data lines and the dummy data lines as a holding capacitor and a sampling capacitor.

3. A digital-analog converter comprising:
   a gray scale generator for generating gray scale voltages corresponding to digital data input through charge sharing between a plurality of data lines and a plurality of dummy data lines;
   a switching signal generator for providing operation control signals for a plurality of switches of the gray scale generator; and
   a reference voltage generator for generating reference voltages and for providing the reference voltages to the gray scale generator,
   wherein the gray scale generator comprises:
      a sampling capacitor formed by parasitic capacitance components existing in at least one of the dummy data lines;
      a holding capacitor formed by parasitic capacitance components existing in at least one of the data lines;
      a first switch for controlling a reference voltage at a high level to be supplied to the sampling capacitor depending on respective bit values of input digital data;
      a second switch for controlling a reference voltage at a low level to be supplied to the sampling capacitor depending on the respective bit values of the input digital data;
      a third switch provided between the sampling capacitor and the holding capacitor for applying the charge sharing between the sampling capacitor and the holding capacitor; and
      a fourth switch connected to the holding capacitor to initialize the holding capacitor.

4. The digital-analog converter as claimed in claim 3, wherein the holding capacitor is initialized with at least one of the reference voltage at the high level or the reference voltage at the low level by turning on the fourth switch.

5. The digital-analog converter as claimed in claim 3, wherein the charge sharing between the sampling capacitor and the holding capacitor is executed for a plurality of periods during which each of a plurality of bits of the digital data is input, and wherein a result of the charge sharing executed at a last one of the plurality of periods is applied to the data lines as fine ones of the gray scale voltages.

6. The digital-analog converter as claimed in claim 5, wherein the charge sharing evenly distributes the reference voltages stored in the sampling and holding capacitors by turning on the third switch for a period of each of the plurality of periods.

7. The digital-analog converter as claimed in claim 6, wherein the third switch is turned on after a turn on operation of at least one of the first switch or the second switch is completed.

8. The digital-analog converter as claimed in claim 1, wherein the dummy data lines are adjacent to the data lines so that the data lines and the dummy lines are alternately formed on a panel of a display device including the digital-analog converter.

9. A data driver comprising:
   a shift register unit for providing sampling signals by generating a shift register clock;
   a sampling latch unit for sampling and latching digital data having a plurality of bits by receiving the sampling signals for every column line;
   a holding latch unit for simultaneously receiving and latching digital data latched in the sampling latch unit, and for converting and outputting the digital data in a serial state for every each of the bits of the digital data; and
   a digital-analog converter for generating gray scale voltages to correspond to bit values of the digital data supplied from the holding latch unit in a serial state through charge sharing between a plurality of data lines and a plurality of dummy data lines provided on a panel of a display device including the data driver and for providing the gray scale voltages to the data lines.

10. The data driver as claimed in claim 9, wherein the holding latch unit receives a shift register clock signal generated from the shift register, and converts the digital data received in a parallel state into the serial state through the clock signal and outputs the digital data in the serial state to the digital-analog converter.

11. The data driver as claimed in claim 9, wherein the digital-analog converter generates the gray scale voltages corresponding to the bit values of the digital data input through charge sharing between at least one of the data lines and at least one of the dummy data lines formed adjacent to the at least one of the data lines and outputs the gray scale voltages to corresponding pixels connected to the data lines.

12. The data driver as claimed in claim 11, wherein the charge sharing is executed by using respective parasitic capacitance components existing in the at least one of the data lines and the at least one of the dummy data lines as a holding capacitor and a sampling capacitor.

13. The data driver as claimed in claim 11, wherein the data lines and the dummy lines are alternately formed on the panel.

14. A flat panel display device comprising:
   a display region comprising a plurality of pixels connected with a plurality of scan lines arranged in a first direction, a plurality of data lines arranged in a second direction, and a plurality of dummy data lines formed adjacent to the respective data lines;

a data driver for supplying gray scale voltages to the plurality of pixels; and a scan driver for supplying scan signals to the scan lines, wherein the data driver generates the gray scale voltages corresponding to digital data input through charge sharing between the data lines and the dummy data lines and provides the gray scale voltages to corresponding ones of the pixels.

15. The flat panel display device as claimed in claim 14, wherein the charge sharing is executed by using respective parasitic capacitance components existing in the data lines and the dummy data lines as a holding capacitor and a sampling capacitor.

16. The flat panel display device as claimed in claim 14, wherein the data lines and the dummy lines are alternately formed on a panel of the flat panel display device, and wherein the respective data lines and the dummy data lines adjacent to the respective data lines are foamed in pairs.

17. The flat panel display device as claimed in claim 14, where the pixels are connected with the data lines arranged in the second direction, and wherein the pixels are not connected with the dummy data lines formed adjacent to the respective data lines.

18. A data driving method of a flat panel display device comprising a plurality of pixels, the method comprising the steps of:

serially inputting each of a plurality of bits of digital data;

executing charge sharing between respective data lines and dummy data lines formed adjacent to the respective data lines for a plurality of periods during which each of the plurality of bits of the digital data is input; and applying a result of the charge sharing executed at a last one of the plurality of periods to corresponding ones of the pixels through the data lines as final gray scale voltages.

19. The data driving method of a flat panel display device as claimed in claim 18, wherein the charge sharing is executed by using respective parasitic capacitance components existing in the data lines and the dummy data lines formed adjacent to the data lines as a sampling capacitor and a holding capacitor.

20. The data driving method of a flat panel display device as claimed in claim 19, wherein the charge sharing evenly distributes a plurality of reference voltages stored in the sampling and holding capacitors for a period of each of the plurality of periods.

\* \* \* \* \*

UNITED STATES PATENT AND TRADEMARK OFFICE
CERTIFICATE OF CORRECTION

| | |
|---|---|
| PATENT NO. | : 7,944,458 B2 |
| APPLICATION NO. | : 11/656805 |
| DATED | : May 17, 2011 |
| INVENTOR(S) | : Oh Kyong Kwon et al. |

It is certified that error appears in the above-identified patent and that said Letters Patent is hereby corrected as shown below:

In the Claims:

Column 12, Claim 9, line 35          Delete "every"

Column 13, Claim 16, line 21         Delete "foamed"
                                     Insert -- formed --

Signed and Sealed this
Twenty-seventh Day of March, 2012

David J. Kappos
*Director of the United States Patent and Trademark Office*